United States Patent [19]
Makuta

[11] Patent Number: 5,392,311
[45] Date of Patent: Feb. 21, 1995

[54] LASER ELEMENT

[75] Inventor: Akio Makuta, Yokohama, Japan

[73] Assignee: Kabushiki Kaisha Toshiba, Kawasaki, Japan

[21] Appl. No.: 224,305

[22] Filed: Apr. 7, 1994

[30] Foreign Application Priority Data

May 31, 1993 [JP] Japan .................. 5-129420

[51] Int. Cl.6 .............................................. H01S 3/08
[52] U.S. Cl. ...................................... 372/96; 372/102; 372/45; 372/26
[58] Field of Search ................ 372/92, 45, 102, 96, 372/26

[56] References Cited

U.S. PATENT DOCUMENTS 4,701,930 10/1987 Akiba et al. ...................... 372/96
5,088,097 2/1992 Ono et al. ........................ 372/96
5,155,736 10/1992 Ono et al. ........................ 372/96
5,325,392 6/1994 Tohmori et al. .................. 372/96

Primary Examiner—Léon Scott, Jr.
Attorney, Agent, or Firm—Finnegan, Henderson, Farabow, Garrett & Dunner

[57] ABSTRACT

A laser element has a first periodic structure (i.e., a diffraction grating) provided along an optical waveguide, and optical feedback is performed by the first periodic structure. Structural factors, including at least one of the width, thickness and refractive index of the optical waveguide, the composition of the laser medium, or the period of the first periodic structure is continuously changed at least in part in the axial direction of a cavity In such a manner that the continuous change provides a periodic structure of second, third or higher order.

18 Claims, 4 Drawing Sheets

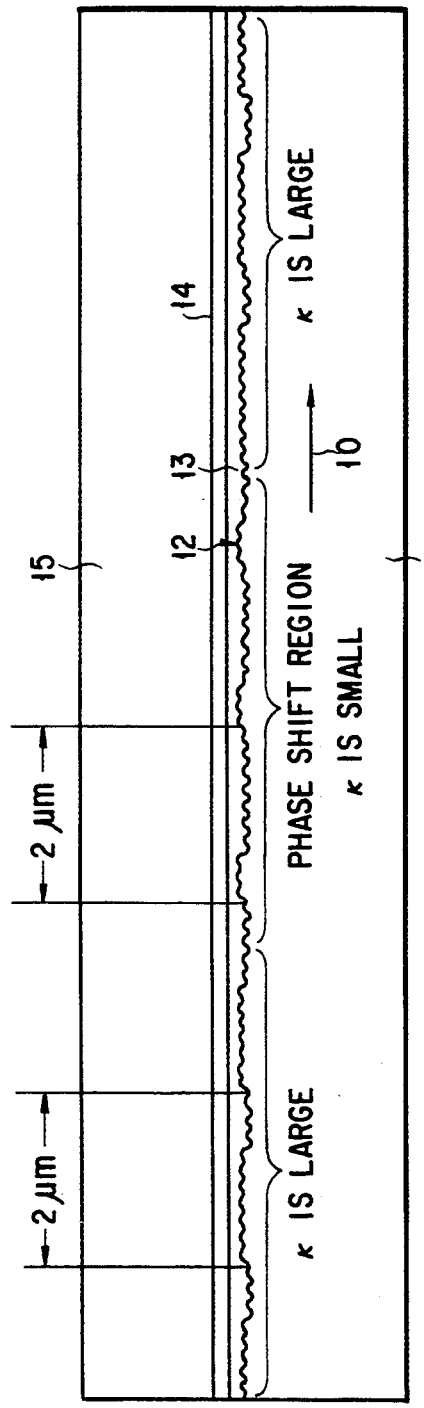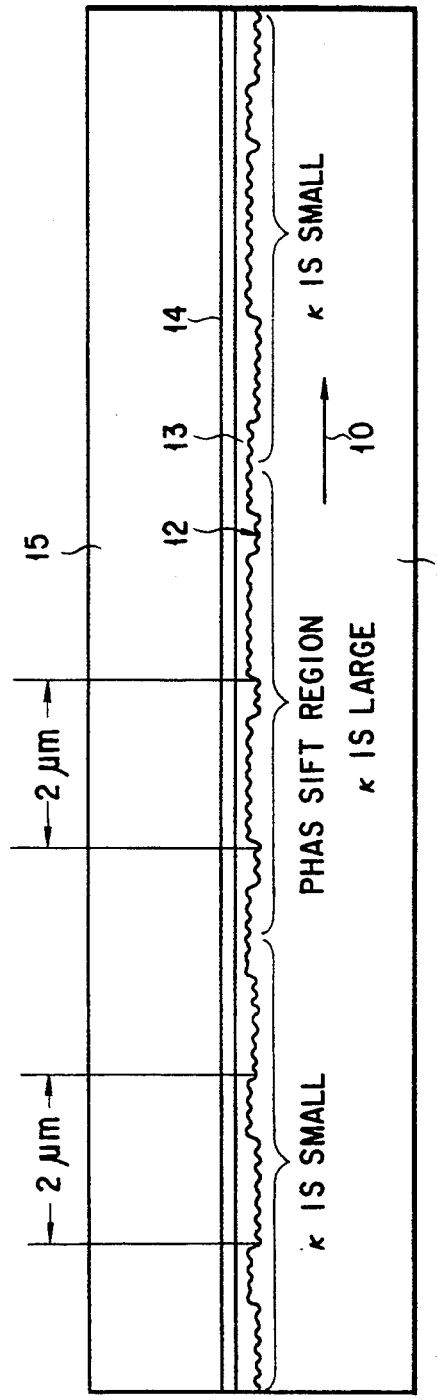

LASER ELEMENT

BACKGROUND OF THE INVENTION

1. Field of the Invention

The present invention relates to laser elements, and more particularly to laser elements of distributed feedback and distributed Bragg reflector types wherein a first periodic structure for optical feedback is provided along an optical waveguide path.

2. Description of the Related Art

A distributed feedback type laser diode (hereinafter referred to as a DFB-LD), in which a periodic structure for changing the refractive index (i.e., a diffraction grating) is provided along an optical waveguide path, is indispensable to long-haul high bit-rate optical communication.

As is well known in the art, however, the DFB-LD does not always ensure single-mode oscillation unless the reflection factors of the end facets of a laser cavity are optimally adjusted. (Refer to William Streifer, Robert D. Burnham and Donald R. Scifres, IEEE J. Quantum Electronics, vol. QE-11, pp. 154–161, April, 1975)

In order to reliably ensure single longitudinal-mode oscillation, a phase shift structure is proposed wherein the phase of light is changed inside a laser cavity. (Refer to H. A. Haus and C. V. Shank, "Antisymmetric taper of distributed feedback lasers", IEEE J. Quantum Electronics, vol. QE-12, pp. 532–539, 1975)

A structure in which single-mode oscillation is actually confirmed is a $\lambda/4$ shift type DFB laser ($\lambda$: lasing wavelength). In this type of DFB laser, the phase of a diffraction grating is changed by $\pi$ (i.e., the phase of an oscillated wave is changed by $\pi/2$), so as to control the reflection at the end facets. (Refer to Utaka et al., "Electronics Letters", vol. 20, No. 24, 1984, pp. 1008–1010)

An equivalent $\lambda/4$ phase shift type DFB laser is also proposed, wherein the effective refraction factor of an active medium is changed by varying the width of a waveguide path in the center of a laser cavity. In this type of DFB laser, the phase of light is shifted before and after the optical wave passes through the portion at which the effective phase shifter of the active medium dimension is changed. In this structure the phase of light is shifted distributedly, whereas in the ordinary phase shift type DFB laser the phase is shifted concentratedly by the diffraction grating. (Refer to Soda et al., IEEE J. Quantum Electronics, vol. QE-23, No. 6, pp. 804–814, June, 1987)

As can be seen from the above, the phase shift methods presently known are limited to two methods, one being a method wherein the phase of a diffraction grating is made discontinuous and the other being a method wherein a waveguide path is changed in width and thickness.

A description will now be given of the problems entailed in these two conventional phase shift methods.

First, the $\lambda/4$ shift type DFB laser, wherein a diffraction grating is shifted, will be described.

In the case where the coupling coefficient $\kappa$ of the $\lambda/4$ shift type DFB laser (the coupling coefficient $\kappa$ represents an optical wave feedback amount) is large, the optical intensity is high in the center of a laser cavity, as indicated by line II in FIG. 6, since optical waves are likely to concentrate at the shifted portion of the diffraction grating. Since this results in axial hole burning, and the single-mode characteristic is adversely affected, the performance of the laser is considerably affected. The problem is attributable to the above-mentioned fact that the phase of light is shifted concentratedly by the diffraction grating. (Refer to Soda et al., "IEEE Journal of Quantum Electronics, vol. QE-23, No. 6, June, 1987)

Conversely, in the case where the coupling coefficient $\kappa$ is small, the light inside the laser cavity concentrate at the end facets, as indicated by line III in FIG. 6. Since the light intensity distribution in the axial direction of the laser cavity is not uniform in this case as well, the threshold current increases and the suppression ratio of the side mode decreases.

As mentioned above, it is very difficult to adjust the coupling coefficient $\kappa$ of the $\lambda/4$ shift type DFB laser.

A variety of methods for shifting a diffraction grating during its manufacturing process are proposed. For example, "Electronics Letters", vol. 20, No. 24, pp 1008–1010, 1984 discloses a method wherein positive resist and negative resist are used, and Research Report of Electronic Information Communication Society, OQE86-150 discloses a method wherein a phase shift film is used. However, none of these known methods ensure a high yield of manufacture.

The methods wherein a diffraction grating is shifted have problems in that a step section is undesirably produced at the shifted portion of the diffraction grating and in that the diffraction grating has different shapes between one and the other sides of the shifted portion.

As described above, many problems remain unsolved with respect to the phase shift structures wherein the diffraction grating is shifted.

A description will now be made of the structure wherein phase shift is equivalently produced by changing the width of a waveguide.

If the phase shift amount in this structure is $\lambda/4$, the concentration of optical waves in the phase shift region can be significantly prevented in comparison with the above-mentioned case where the phase of the diffraction grating is made discontinuous. This is because the length of the phase shift region is normally several tens of $\mu$m.

In addition, the diffraction grating used in this phase shift structure can be easily manufactured since its shape is uniform and continuous. Therefore, it can be said that this phase shift structure is more advantageous than the phase shift structure wherein the diffraction grating is shifted.

However, it is difficult to form even a waveguide having a uniform and constant width since the width must be controlled with high precision. This being so, it is more difficult to form a waveguide having different widths. As a matter of fact, it is extremely difficult to accurately control the width and shape of the phase shift portion of the waveguide. Therefore, it is not easy to accurately adjust the phase shift amount.

Since the equivalent refractive index of the active layer considerably varies at the width-changed portion of the waveguide, the lasing mode and the radiation mode (from the equivalent refractive index-varying portion) interfere with each other. As a result, the far-field pattern of light output is likely to become very irregular, as shown in FIG. 8. The radiation angle of the radiation mode cannot be accurately known beforehand and is therefore difficult to control. For coupling to another optical element, such as an optical fiber, it is desirable that the far-field pattern have no irregularity and narrow expansion angle.

As a single-mode oscillation structure for use in a distributed feedback type laser element (which is a type other than the phase shift type structures described above), a structure wherein the period of the diffraction grating is continuously changed in a laser cavity is proposed. Also, a structure wherein the width of a waveguide is continuously changed to form a tapered waveguide is proposed. These two structures give solution to the problem that the far-field pattern becomes distorted.

With respect to the structure wherein the period of the diffraction grating is continuously changed, the manufacture of the diffraction grating (i.e., a chirped diffraction grating) and the determination of the diffraction grating period suitable for the element become problems in practice. As for the structure wherein the width of the waveguide is continuously changed, the control of the width of the waveguide is not easy, as mentioned above.

As a method wherein phase shift is equivalently produced by changing the structure of a waveguide, Jpn. Pat. Appln. KOKAI Publication No. 61-88584 proposes a method for changing the thickness of the waveguide layer.

According to the method proposed in the Japanese publication, a groove corresponding to a phase shift is formed in a substrate, and the thickness of the subsequently grown waveguide layer is changed. However, the diffraction grating formed on the substrate is inevitably flattened by the etching process presently available. It is therefore not easy to permit the diffraction grating to remain in the phase shift region.

In addition, the portion where the diffraction grating is located and the other flat portion have different crystal orientations at their exposed surfaces. As a result, the waveguide layer subsequently grown has not only different crystalline characteristics but also different thicknesses, depending upon locations. Therefore, there is inevitably a step section in the active layer.

Further, since the control of the thickness of the grown waveguide layer is difficult, it is not possible to obtain a desirable phase shift. For these reasons, the method proposed in the Japanese publication is not practical.

It is thought to form the diffraction grating after the waveguide layer is grown. This method may enable easy control of the phase shift amount, since the layer structure is determined when the diffraction grating is formed.

However, if the diffraction grating is formed after the thickness of the waveguide layer is changed, the coated photoresist is inevitably thicker at the depressed portion of the step section than at the projected portion. In the depressed portion, therefore, the diffraction grating has different shapes or depths, and in the worst case no diffraction grating is formed.

As described above, it is very difficult to control the shape and depth of the diffraction grating not only at the projected portion but also at the depressed portion.

In the meantime, a method for producing a number of phase shifts in a laser cavity is proposed so as to obtain a narrow spectral line width for the purpose of coherent light communication. (Refer to Kimura et al., "Electron Lett.", vol. 23, 1987, pp. 1014)

However, the manufacture of such an element structure is very difficult as long as the conventional phase shift methods are applied.

As has been described, not only the conventional method for producing phase shift at a single point but also the conventional method for equivalently providing a phase shift region in the axial direction of a laser cavity is limited in advantage, controllability and productivity.

In summary, the conventional methods or structures have the following disadvantages:

(1) It is difficult to control the coupling coefficient $\kappa$ and structural parameters in laser elements of distributed feedback type and distributed Bragg reflector type.

(2) The structure wherein phase shift is equivalently produced inevitably has a stepped section, and this stepped section produces adverse effects. That is, the far-field pattern becomes distorted due to the radiation mode, the phase shift region cannot be formed with high precision, and the stepped section cannot be processed easily.

(3) Since the concentration of light at the phase shift region results in axial hole burning, the performance of the element is adversely affected.

SUMMARY OF THE INVENTION

Accordingly, an object of the present invention is to provide a laser element which solves the problems mentioned above and which can be easily manufactured, with a variety of parameters (including the coupling coefficient $\kappa$ in the axial direction of a laser cavity) being controlled with high accuracy.

This object is attained by a laser element which comprise:

a diffraction grating formed on the surface of a substrate; the diffraction grating having first and second periodic structures and including a region wherein the phase of the second periodic structure is shifted;

a waveguide layer formed on the diffraction grating;

an active layer formed on the waveguide layer; and a clad layer formed on the active layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1A is a sectional view showing a laser element according to the first embodiment of the present invention, and depicts the case where the coupling coefficient $\kappa$ of a phase shift region is set to be smaller than those of the other regions in the center of a laser cavity;

FIG. 1B is also a sectional view showing the laser element according to the first embodiment of the present invention, and depicts the case where the coupling coefficient $\kappa$ of the phase shift region is set to be larger than those of the other regions in the center of the laser cavity;

DETAILED DESCRIPTION OF THE PREFERRED EMBODIMENTS

Figure 2:
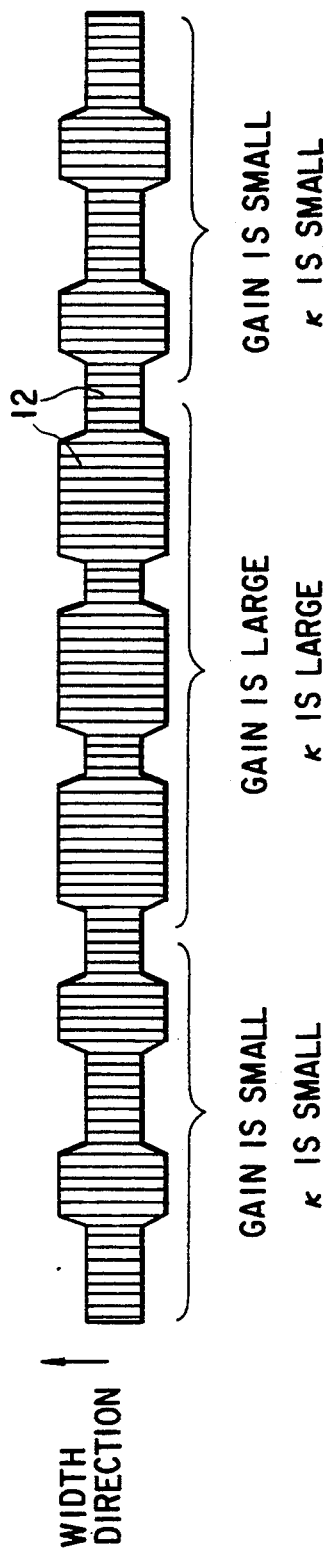
FIG. 2 is a plan view showing a laser element according to the second embodiment of the present invention.

The present invention will now be described, referring to the embodiments shown in the drawings. In the descriptions below, the same reference numerals or symbols will be used to denote the corresponding structural elements of different embodiments, so as to avoid repetition of the same explanations.

First, the laser element according to the first embodiment of the present invention will be described. FIGS. 1A and 1B are sectional views showing the laser element of the first embodiment. FIG. 1A depicts the case where the coupling coefficient κ of a phase shift region is set to be smaller than those of the other regions in the center of a laser cavity, while FIG. 1B depicts the case where the coupling coefficient κ of the phase shift region is set to be larger than those of the other regions in the center of the laser cavity.

The laser element of the first embodiment comprises a first structure by which the diffraction grating of the cavity is made uneven.

Referring to FIGS. 1A and 1B, reference numeral 11 denotes an InP substrate, reference numeral 12 denotes a diffraction grating formed on the InP substrate 11, reference numeral 13 denotes an InGaAsP waveguide layer 13, reference numeral 14 denotes an InGaAsP active layer, and reference numeral 15 denotes an InP clad layer.

As is shown in FIGS. 1A and 1B, a second periodic uneven structure having a period of about 2 μm is provided, by photolithography, on the first periodic uneven structure (i.e., the diffraction grating 12) formed on the substrate 11.

In the case shown in FIG. 1A, the coupling coefficient κ of a phase shift region is smaller than those of the other regions in the center of a laser resonator. The closer to the active layer the diffraction grating is, the larger is the coupling coefficient κ. In other words, the coupling coefficient κ is small in the regions where the diffraction grating is away from the active layer.

In the case shown in FIG. 1B, the coupling coefficient κ is set in the opposite manner to that shown in FIG. 1A. In FIG. 1B, the second periodic uneven structure is comparatively shallow, and its period is about 2 μm. With this structure, the waveguide layer 13, formed on the second periodic uneven structure by crystal growth, can be made as flat as possible. The element is manufactured, with the second periodic uneven structure being modulated in this manner.

Next, the laser element according to the second embodiment will be described.

FIG. 2 is a plan view showing the laser element of the second embodiment.

In the second embodiment, the width of a waveguide is modulated (varied).

In FIG. 2, the layer structure including the diffraction grating 12 is depicted. In the portions where the layer structure is wide, the amount of light feedback by the diffraction grating 12 is large, and the laser gain is greater in the wide layer structure portions than in the narrow layer structure portions. Therefore, the light are diffracted not only due to the equivalent refractive index corresponding to the second periodic change in width but also due to the first periodic gain by diffraction grating. The structure depicted in FIG. 2 can be obtained merely by photolithographic patterning.

The laser element of the second embodiment may be provided with a second periodic structure wherein the composition of the laser medium (i.e., one of the structural factors of the waveguide layer) is changed in the axial direction of the cavity.

The laser element according to the third embodiment will be described.

Figure 3:
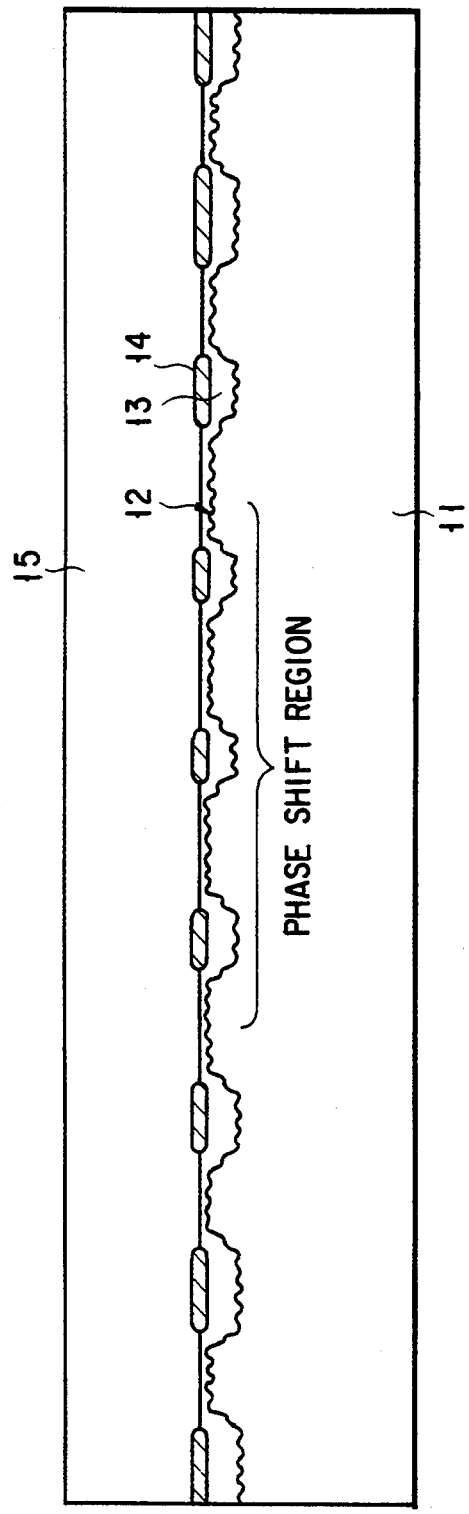
FIG. 3 is a sectional view showing a laser element according to the third embodiment of the present invention.

FIG. 3 is a sectional view showing the laser element of the third embodiment.

In the third embodiment, the active layer is periodically modulated by the second periodic uneven structure.

In FIG. 3, the second periodic uneven structure is deep. With this structure, the waveguide layer 13 cannot be embedded in a flat state and therefore has a periodic structure similar to the second periodic structure. Likewise, the active layer 14 also has a periodic structure similar to the second periodic structure. Accordingly, the light is diffracted not only by the diffraction grating 12 but also by the periodic structures of the waveguide layer 13 and active layer 14.

The periodic structure of the waveguide layer 13 is specifically a structure wherein the thickness of the waveguide layer 13 (i.e., one of the structural factors of the waveguide layer) is periodically changed in the axial direction 10 of the cavity.

In the case where, for example, the thickness of the waveguide layer is changed, the "second periodic structure" is intended to mean a structure wherein the ratio of the thickness of thick portions of the waveguide layer to that of thin portions thereof is arbitrarily changed in axial positions of the cavity, and the "modulation" is intended to refer to the changing of the thickness of the waveguide layer to obtain such a structure.

If the period of the second periodic structure is nearly equal to an integral multiple of the period of the first structure by which the diffraction grating of the laser cavity is made uneven, it is possible to predict the direction in which optical waves are output from the waveguide layer by means of the second periodic structure, i.e., the direction in which optical waves are output in the radiation mode. In addition, if the second periodic structure has such a period, it is possible to contribute to the feedback of optical waves, thereby suppressing the percentage of the radiation mode and suppressing the distortion of the far-field pattern.

In the case where guiding-mode of light little radiate, where a changing rate in the stepped section of the phase shift region of a phase shift type laser element is so small that the radiation mode does not have much effects on the guiding mode, or where radiation mode and the guiding mode are prevented from interfering with each other by providing an absorption band or the like, the period of the second periodic structure need not be an integral multiple of that of the first periodic structure. If the period of the second periodic structure is not an integral multiple of the first periodic structure, a phase shift region for shifting the phase to an arbitrary degree can be provided at an arbitrary position inside the cavity.

In order to obtain a practically-advantageous phase shift type laser element, it is necessary to modulate at least the second periodic structure. The rate at which the second periodic structure is changed is determined on the basis of the periodic change in the structural factors of the waveguide layer and in accordance with the degree of modulation. In other words, the equivalent phase shift structure is realized not by the periodic change in the structural factors but by the degree of modulation. The period of the second periodic structure is shorter than the phase shift region of the conventional equivalent phase shift structure, but it is far longer than the period of the first periodic structure. Therefore, the period of the second periodic structure can be easily determined or controlled. This being so, the laser element embodying the present invention has such an element structure that enables a desirable phase shift structure to be designed by modulation.

In addition, the element structure of the present invention is advantageous in that the coupling coefficient $\kappa$ or other factors can be changed in the axial direction of the cavity.

Furthermore, if the period of the second periodic structure is an integral multiple of that of the first periodic structure, optical feedback can be realized by means of a gain/loss periodic structure obtained by modulating the active layer. Hence, the oscillation characteristic in the single longitudinal-mode can be improved.

The laser element according to the fourth embodiment will be described.

Figure 4:
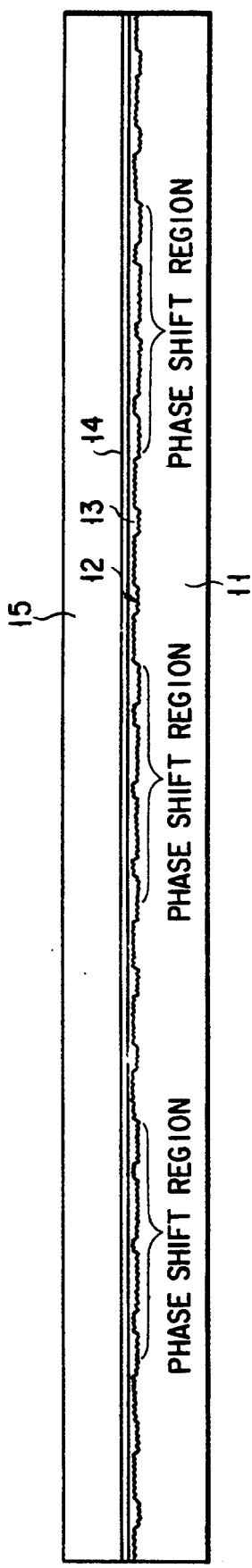
FIG. 4 is a sectional view showing a laser element according to the fourth embodiment of the present invention.

FIG. 4 is a sectional view showing the laser element of the fourth embodiment.

The fourth embodiment comprises a fourth structure wherein a number of phase shift regions are provided in a laser cavity.

As can be seen from the descriptions of the first to third embodiments, the structure for modulating the equivalent refractive index in the thickness and width directions of the active layer can be provided at an arbitrary position inside the laser cavity such that it can shift the phase to an arbitrary degree. In the case depicted in FIG. 4, a structure for modulating the thickness of the active layer is provided at three points in the laser cavity.

The laser element according to the fifth embodiment will be described.

Figure 5:
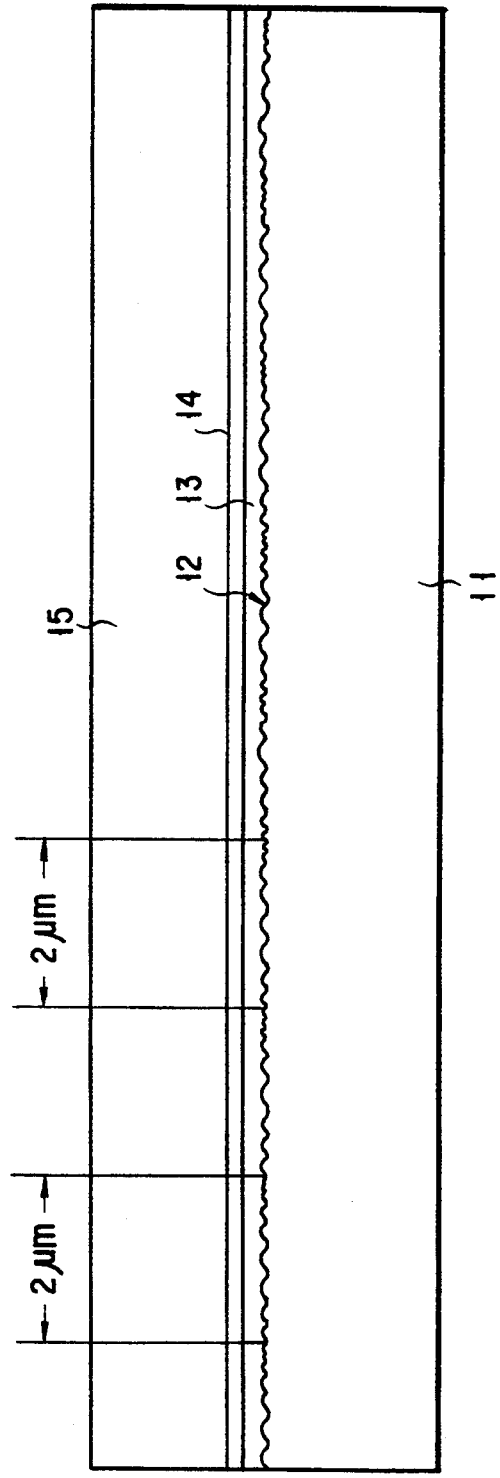
FIG. 5 is a sectional view showing a laser element according to the fifth embodiment of the present invention.

FIG. 5 is a sectional view showing the laser element of the fifth embodiment.

In the fifth embodiment, the chirp of the diffraction grating whose period is continuously changed (i.e., a chirped diffraction grating) is modulated by the second periodic structure. In the case of the fifth embodiment, the second periodic structure has a period corresponding to that of the chirp of the chirped diffraction grating.

According to the first to fifth embodiments mentioned above, a variety of parameters can be reliably controlled when laser elements are manufactured, such that the phase shift can be controlled to an arbitrary degree. In addition, light can be prevented from concentrating in the phase shift region, thereby obtaining a uniform optical intensity distribution in the axial direction of the cavity.

When the elements of the first to fifth embodiments are used as phase shift type elements, a non-reflection film has to be formed at the end facets of the element, though illustration of such films is omitted from FIGS. 1 to 5. Such films reduce the reflectivity of the end facets of the element, and the phase shift effect becomes maximal, accordingly.

Figure 6:
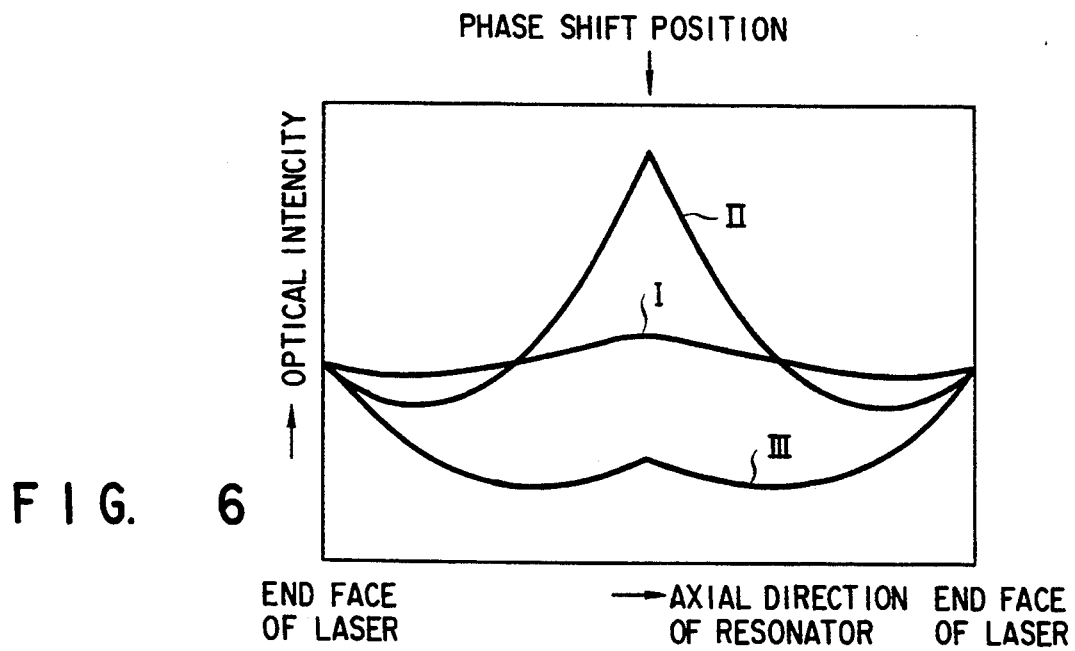
FIG. 6 is a graph showing the optical intensity distribution inside a laser cavity.

In the conventional phase shift structure, the optical intensity distribution inside the laser cavity is very sensitive to a change in the coupling coefficient $\kappa$, as indicated by lines II and III in FIG. 6. In the present invention, the optical intensity distribution can be freely controlled. If, for example, a phase shift region is provided in the center of the laser cavity by means of the first structure, the resultant optical intensity distribution describes a very flat line, as indicated by line I in FIG. 6.

The structural elements of the foregoing embodiments may be selectively combined so as to obtain an apparatus, a circuit or a method having a function similar or different from the functions of the foregoing embodiments. What is obtained by such a combination can constitute another embodiment of the present invention.

Figure 7A:
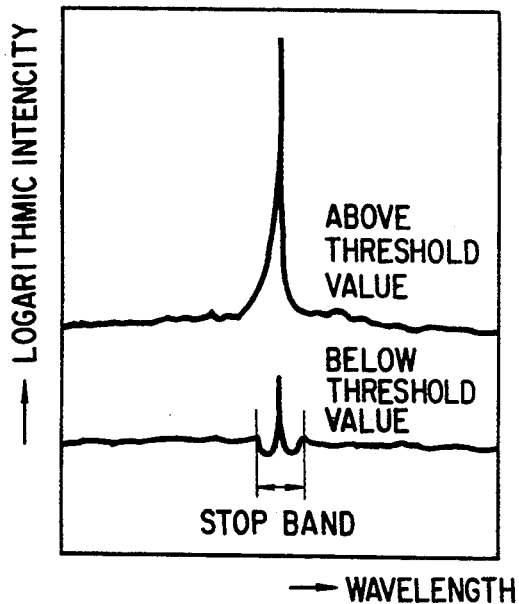
FIG. 7A is a graph showing a characteristic of the laser element of the first embodiment and depicting a typical oscillation spectrum.
Figure 7B:
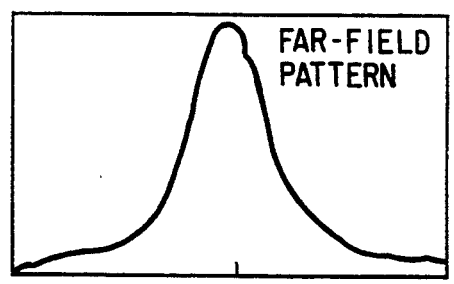
FIG. 7B is a graph also showing a characteristic of the laser element of the first embodiment and depicting a typical far-field pattern.

FIGS. 7A and 7B are graphs showing characteristics of the laser element of the first embodiment. FIG. 7A depicts a typical oscillation spectrum of the laser element, and FIG. 7B depicts a typical far-field pattern of the same laser element.

Referring to FIG. 7A, where the spectrum is below the threshold value, a resonance peak appears in the center of the stop band, which is a feature of a $\lambda/4$ shift type laser. Where the spectrum is above the threshold value, the side mode is fully suppressed, and single longitudinal-mode oscillation is ensured.

Figure 8:
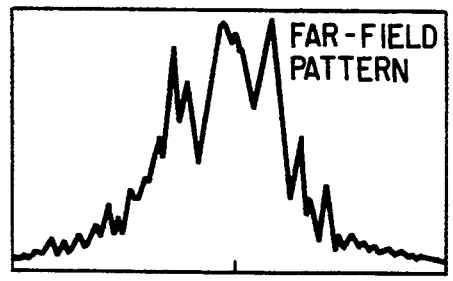
FIG. 8 is a graph showing a typical far-field pattern of a conventional laser element.

In the conventional structure wherein the waveguide is widened in the center of the laser cavity, the far-field pattern is very irregular, as shown in FIG. 8. In contrast, the far-field pattern obtained in the present invention is smooth and has a narrow angle of expansion. In addition, the element of the present invention fully suppresses the adjacent mode and ensures single longitudinal-mode oscillation, even when a modulating operation is performed at high output or at high speed. It should be also noted that elements having such remarkable performance could be manufactured with high yield from one semiconductor substrate.

Like an element having the first periodic structure, an element having the second periodic structure could also be manufactured with high yield.

An element having the fourth structure mentioned above was manufactured such that the length of a cavity was 1.0 mm and three phase shift regions were provided in the cavity. This element ensured a narrow spectral line width. In regard to such a long laser cavity, the prior art cannot accurately control the coupling coefficient $\kappa$, so as to ensure single-mode oscillation and to narrow the spectral line width. The present invention enabled easy and accurate control of the coupling coefficient $\kappa$.

Needless to say, the structure and method of the present invention are applicable not only to an element using InGaAsP but also to an element using AlGaAs or other materials.

In addition, the present invention can be applied to a variety of laser elements, without its advantages being affected, as long as the laser elements are distributed feedback and Bragg reflector types wherein a first periodic structure for optical feedback is provided along an optical waveguide. The advantages of the present invention are particularly remarkable in the field of optical communication.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A laser element comprising:
a diffraction grating formed on a surface of a substrate, said diffraction grating having first and second periodic structures and including a region in which a phase of the second periodic structure is shifted, the first periodic structure being a structure in which uneven portions are formed periodically;
a waveguide layer formed on the diffraction grating;
a clad layer formed on the active layer.

2. A laser element according to claim 1, wherein the second periodic structure is a structure in which uneven portions are formed in a period longer than a period in which uneven portions of the first periodic structure are formed.

3. A laser element according to claim 1, wherein a coupling coefficient κ of the region in which the phase of the second periodic structure is shifted is smaller than a coupling coefficient of any other region.

4. A laser element according to claim 1, wherein a coupling coefficient κ of the region in which the phase of the second periodic structure is shifted is larger than a coupling coefficient of any other region.

5. A laser element according to claim 1, wherein the second periodic structure is a structure in which the diffraction grating periodically has wide portions.

6. A laser element according to claim 1, wherein said waveguide layer has a third structure in which uneven portions are formed in a period longer than a period in which uneven portions of the first periodic structure are formed.

7. A laser element according to claim 1, wherein said active layer has a fourth structure in which uneven portions are formed in a period longer than a period in which uneven portions of the first periodic structure are formed.

8. A laser element according to claim 1, wherein said diffraction grating includes a plurality of regions in each of which the phase is shifted.

9. A laser element comprising:
a diffraction grating formed on a surface of a substrate, said diffraction grating having a first periodic structure in which uneven portions are periodically formed, a second periodic structure in which uneven portions are formed in a period longer than a period in which the uneven portions of the first periodic structure are formed, and a third periodic structure in which wide portions are periodically formed, said diffraction grating including a region in which a phase of the second periodic structure is shifted;
a waveguide layer formed on the diffraction grating;
an active layer formed on the waveguide layer; and
a clad layer formed on the active layer.

10. A laser element comprising:
a diffraction grating formed on a surface of a substrate, said diffraction grating having first and second periodic structures and including a region in which a phase of the second periodic structure is shifted;
a waveguide layer formed on the diffraction grating and having uneven portions which are formed in a period longer than a period of the first periodic structure;
an active layer formed on the waveguide layer and having uneven portions which are formed in a period longer than the period of the first periodic structure; and
a clad layer formed on the active layer.

11. A laser element according to claim 10, wherein the first periodic structure is a structure in which uneven portions are formed periodically.

12. A laser element according to claim 10, wherein the second periodic structure has a structure in which uneven portions are formed in a period longer than a period of the first periodic structure.

13. A laser element comprising:
a chirped diffraction grating formed on a surface of a substrate, said chirped diffraction grating having uneven portions formed in periods which are continuously changed;
a waveguide layer formed on the chirped diffraction grating;
an active layer formed on the waveguide layer; and
a clad layer formed on the active layer.

14. A laser element according to claim 14, wherein said chirped diffraction grating has wide portions periodically formed.

15. A laser element comprising:
a first structure for providing a periodic change for a diffraction grating along an optical waveguide inside a cavity, said first structure being for optical feedback; and
a second structure for periodically changing structural factors, including at least one of a width, a thickness and a refractive index of the optical waveguide, at least in part of the cavity in the axial direction of the cavity.

16. A laser element according to claim 15, wherein said structural factors are changed to such an extent that the cavity structure is modulated at least in part in the axial direction thereof.

17. A laser element comprising:
a first structure formed on a diffraction grating along an optical waveguide inside a cavity, said first structure being for optical feedback and permitting the diffraction grating to have uneven portions formed in periods that are continuously changed;
a second structure for periodically changing structural factors, including at least one of a width, a thickness and a refractive index of the optical waveguide, at least in part of the cavity in the axial direction of the cavity.

18. A laser element according to claim 17, wherein said structural factors are changed to such an extent that the cavity structure is modulated at least in part in the axial direction thereof.

* * * * *

UNITED STATES PATENT AND TRADEMARK OFFICE
CERTIFICATE OF CORRECTION

PATENT NO. : 5,392,311
DATED : February 21, 1995
INVENTOR(S) : Akio MAKUTA

It is certified that error appears in the above-indentified patent and that said Letters Patent is hereby corrected as shown below:

Abstract, Title Page, Line 10, change "In " to --in--.

Claim 1, Column 9, Line 25, after ";" insert
--an active layer formed on the waveguide layer; and--.

Signed and Sealed this

Fourth Day of July, 1995

BRUCE LEHMAN

Attest:

Attesting Officer

Commissioner of Patents and Trademarks